United States Patent
Jewram et al.

(10) Patent No.: US 12,238,899 B2
(45) Date of Patent: Feb. 25, 2025

(54) THERMAL MANAGEMENT OF HIGH HEAT FLUX MULTICOMPONENT ASSEMBLY

(71) Applicant: Henkel AG & Co. KGaA, Duesseldorf (DE)

(72) Inventors: Radesh Jewram, Lakeville, MN (US); Yuan Zhao, Tustin, CA (US)

(73) Assignee: Henkel AG & Co. KGaA, Duesseldorf (DE)

( * ) Notice: Subject to any disclaimer, the term of this patent is extended or adjusted under 35 U.S.C. 154(b) by 258 days.

(21) Appl. No.: 17/582,275

(22) Filed: Jan. 24, 2022

(65) Prior Publication Data

US 2022/0151108 A1 May 12, 2022

Related U.S. Application Data

(63) Continuation of application No. PCT/US2020/043116, filed on Jul. 22, 2020.

(60) Provisional application No. 62/877,495, filed on Jul. 23, 2019.

(51) Int. Cl.
  *H02H 5/00* (2006.01)
  *H05K 7/20* (2006.01)

(52) U.S. Cl.
  CPC .................. *H05K 7/20509* (2013.01)

(58) Field of Classification Search
  None
  See application file for complete search history.

(56) References Cited

U.S. PATENT DOCUMENTS

| | | |
|---|---|---|
| 4,819,857 A | 4/1989 | Mizuishi et al. |
| 4,938,992 A | 7/1990 | Mears |
| 5,300,809 A | 4/1994 | Nakamura et al. |
| 5,679,457 A | 10/1997 | Bergerson |
| 5,738,936 A | 4/1998 | Hanrahan |
| 5,950,066 A | 9/1999 | Hanson et al. |
| 6,090,484 A | 7/2000 | Bergerson |
| 6,162,663 A | 12/2000 | Schoenstein et al. |
| 6,197,859 B1 | 3/2001 | Green et al. |
| 6,344,104 B1 | 2/2002 | Sekiya et al. |
| 6,359,334 B1 | 3/2002 | Jiang |
| 6,399,209 B1 | 6/2002 | Misra |
| 6,657,296 B2 | 12/2003 | Ho et al. |
| 6,657,297 B1 | 12/2003 | Jewram et al. |

(Continued)

FOREIGN PATENT DOCUMENTS

| | | |
|---|---|---|
| JP | 2005033156 A | 2/2005 |
| JP | 2017135211 | 8/2017 |
| TW | 201735291 A | 10/2017 |

OTHER PUBLICATIONS

International Search Report issued in connection with International Patent Application No. PCT/US2020/043116 mailed on Nov. 18, 2020.

*Primary Examiner* — Stephen W Jackson
(74) *Attorney, Agent, or Firm* — Steven C. Bauman

(57) ABSTRACT

An electronic package includes a thermal interface for dissipating heat from an electronic component array including a plurality of electronic components secured to a substrate. The thermal interface includes a thin heat spreading layer for transferring heat input from the electronic components along directions transverse to heat flux. The heat spreading layer is part of a laminate structure that is efficiently utilized by spreading thermal energy across an input plane.

20 Claims, 6 Drawing Sheets

(56) References Cited

U.S. PATENT DOCUMENTS

| | | |
|---|---|---|
| 6,667,548 B2 | 12/2003 | O'Connor et al. |
| 6,898,084 B2 | 5/2005 | Misra |
| 6,974,558 B2 | 12/2005 | Yamagata et al. |
| 6,974,723 B2 | 12/2005 | Matayabas, Jr. et al. |
| 7,215,551 B2 * | 5/2007 | Wang .................... H01L 23/42 |
| | | 257/E25.023 |
| 7,399,919 B2 | 7/2008 | McCutcheon et al. |
| 7,485,496 B2 | 2/2009 | Chien et al. |
| 7,535,715 B2 | 5/2009 | Chung |
| 8,076,773 B2 | 12/2011 | Jewram et al. |
| 8,110,919 B2 | 2/2012 | Jewram et al. |
| 9,546,763 B2 | 1/2017 | Augoustidis et al. |
| 9,546,764 B2 | 1/2017 | Augoustidis et al. |
| 10,580,717 B2 | 3/2020 | Liu et al. |
| 11,094,608 B2 * | 8/2021 | Huang ................ H01L 23/3128 |
| 2002/0034651 A1 | 3/2002 | Yamagata et al. |
| 2003/0128521 A1 * | 7/2003 | Matayabas, Jr. .... H01L 23/3737 |
| | | 257/E23.09 |
| 2006/0246276 A1 | 11/2006 | Chung |
| 2007/0164424 A1 | 7/2007 | Dean et al. |
| 2007/0241303 A1 | 10/2007 | Zhong et al. |
| 2009/0195989 A1 * | 8/2009 | Oda .................... H01L 23/3677 |
| | | 361/709 |
| 2010/0309634 A1 * | 12/2010 | Jewram .................... F28F 13/00 |
| | | 361/717 |
| 2012/0234525 A1 | 9/2012 | Norley et al. |
| 2017/0186628 A1 | 6/2017 | Antoniswamy et al. |
| 2017/0263539 A1 | 9/2017 | Gowda et al. |
| 2018/0014431 A1 | 1/2018 | Xu et al. |
| 2018/0374714 A1 | 12/2018 | Stathakis et al. |
| 2019/0055443 A1 | 2/2019 | Kanaya et al. |
| 2019/0198355 A1 | 6/2019 | Basler et al. |

* cited by examiner

THERMAL MANAGEMENT OF HIGH HEAT FLUX MULTICOMPONENT ASSEMBLY

FIELD

The present invention relates to thermal management of electronic devices generally, and more particularly to thermal interface constructions for efficient transmission of thermal energy from an electronic component array to a heat dissipater.

BACKGROUND

Thermal interfaces are widely used in heat dissipating applications where excess thermal energy is desired to be transferred from one location to another. The thermal interface is commonly positioned between such locations in a manner to accommodate the desired heat transfer in an efficient and mechanically useful manner. Example applications of such thermal interfaces include the electronics industry, wherein electronic components must be cooled in order to maintain minimum threshold performance characteristics. Typically, heat is transferred away from the heat-generating electronic devices by thermally coupling the electronic device to a heat dissipater, such as a heat sink, which typically possesses a relatively high thermal dissipation capacity. Heat dissipation characteristics include appropriate materials, configuration, and exposure to cooling media.

Thermal coupling of heat-generating elements, such as electronic components, to heat dissipaters may be facilitated by thermal interface materials and structures. For example, direct physical coupling between a heat-generating electronic component and a heat sink may be difficult due to relative external geometries, materials, and special restrictions in the vicinity of the heat-generating component. Thermal interfaces can therefore act as the physical connection mechanism between the heat-generating element and the heat sink without significant impedance to heat transfer. Because heat transfer can be significantly impeded at thermal barriers where thermal energy must pass through media of relatively low thermal conductivity, thermal interfaces can increase the efficiency of heat transfer to a heat sink by minimizing the presence of thermal barriers. Thermal interfaces can be made flexible to "conform" to surface irregularities thereby minimizing voids that may otherwise act to impede heat transfer.

With the miniaturization and increase in power of microelectronics, heat dissipation has become critical to the performance, reliability and further miniaturization of various electronic devices. Integrated circuits ("ICs") represent example heat-generating electronic components that may require heat dissipation to reliably perform. ICs are typically assembled into packages by physically and electrically coupling them to a substrate such as a circuit board, or more particularly a printed circuit board ("PCB"). An array of ICs and/or other electronic components secured to a substrate forms an electronic assembly. Desire for increased performance of electronic assemblies in a reduced volume leads to an increased heat production per unit area. As a result, improved thermal management solutions are necessary to address the increased heat transfer demand.

A heat-generating component thermally coupled to a thermal interface constitutes a heat source that emits thermal energy through paths of lowest thermal impedance. In applications, for example, in which the heat-generator component is thermally coupled to a uniform thermal interface, thermal energy is typically dissipated along a conical or columnar pattern to the heat sink. Where the heat sink is substantially more thermally conductive than the thermal interface, thermal dissipation from the heat source follows the pathway of lowest thermal impedance to the heat sink. Such pathway, in the case of a uniform thermal interface, is the path of shortest distance between the heat source and the heat sink through the thermal interface. This phenomenon has led to the development of thermal interfaces with anisotropic thermal conductivities, wherein the thermal conductivity through a thickness ("z") direction, the shortest path between the heat source and the heat sink, is of a specially-designed construction tailored to facilitate heat transfer along such "z" direction. An example of such a thermal interface includes an oriented graphite pad with graphite fibers oriented in parallel to the "z" axis through the thickness of the thermal interface. Through such an arrangement, the thermal interface exhibits preferential heat transfer along the "z" axis. Although anisotropic thermal interfaces have proven useful at conducting thermal energy with high thermal conductivity values along a z-axis direction, several drawbacks prevent their universal acceptance. For instance, oriented fiber thermal interfaces tend to be expensive. Additionally, certain applications require that the electronic package be compressed along the z-axis during manufacture, which compression can damage the oriented fibers and degrade overall thermal conductivity.

Certain conventional high thermal conductivity interfaces, including many variants of anisotropic thermal interfaces, exhibit insufficient electrical resistivities to be considered non-conductors. Many applications require electrical isolation of the connected electronic components, wherein such high thermal conductivity interfaces are unsuitable.

It is therefore an object to provide a thermal interface that is a non-conductor through its thickness.

It is a further object to provide a thermal interface that maintains efficient thermal conductivity subsequent to thickness compression.

It is another object to provide a cost-effective thermal interface that is capable of simultaneously dissipating thermal energy from an array of heat-generating electronic components.

It is a still further object to provide an electronic package that utilizes a thermal interface to efficiently dissipate thermal energy from an array of a plurality of spaced-apart electronic components.

SUMMARY

By means of the present invention, excess thermal energy generated by an array of a plurality of electronic components may be efficiently dissipated to a heat dissipater. In particular, the present invention provides a thermal interface that enhances overall thermal conductivity along a direction parallel to a thickness axis by spreading thermal energy from the heat source along x and y axes. The thermal interface utilizes a heat spreading layer that is configured to efficiently conduct heat along x and y axes so as to increase volume utilization of the thermal interface for heat transfer along the z axis to a heat dissipater.

In an example embodiment, an electronic package of the present invention includes a substrate and an electronic component array including a plurality of discrete, spaced-apart electronic components secured to the substrate. The electronic package further includes a heat dissipater and a thermal interface positioned in a thermal pathway between the electronic component array and the heat dissipater. The thermal interface includes a heat spreading layer and a compliant layer, and a thickness defined along a thickness axis through the heat spreading layer and the compliant layer. The heat spreading layer is less than 20% of the thickness and exhibits a first thermal conductivity. The compliant layer exhibits a second thermal conductivity that is substantially less than the first thermal conductivity and a compressive modulus of between $10^4$ Pa-$10^6$ Pa.

In another embodiment, the electronic package of the present invention includes a substrate and an electronic component array including a plurality of discrete, spaced-apart electronic components secured to the substrate. The electronic package further includes a thermal interface including a heat spreading layer and a compliant layer, and a thickness defined along a thickness axis through the heat spreading layer and compliant layer. The heat spreading layer is less than 20% of the thickness and exhibits a first thermal conductivity. The compliant layer exhibits a second thermal conductivity that is substantially less than the first thermal conductivity and a compressive modulus of between $10^4$ Pa-$10^6$ Pa. The heat spreading layer is thermally connected to the electronic component array, and a heat dissipater is thermally connected to the compliant layer of the thermal interface.

A method for preparing an electronic package of the present invention includes providing a thermal interface having a heat spreading layer and a compliant layer, and a thickness defined along a thickness axis through the heat spreading layer and the compliant layer. The thermal interface exhibits an initial thermal conductivity. The heat spreading layer of the thermal interface is less than 20% of the thickness and exhibits a thermal conductivity of at least 100 W/m*K. The compliant layer exhibits a compressive modulus of between $10^4$ Pa $-10^6$ Pa. The thermal interface is affixed in a thermal pathway between a heat dissipater and an electronic component array of a plurality of electronic components secured to a substrate. The thermal interface is compressed along the thickness axis to reduce the thickness such that the thermal interface, having a thickness reduction of up to 50%, exhibits a compressed thermal conductivity that is at least 80% of the initial thermal conductivity. The compressing of the thermal interface may include moving at least one of the substrate and the heat dissipater toward the other of the substrate and the heat dissipater.

DETAILED DESCRIPTION OF THE PREFERRED EMBODIMENTS

The objects and advantages enumerated above together with other objects, features, and advances represented by the present invention will now be presented in terms of detailed embodiments described with reference to the attached drawing figures. Other embodiments and aspects of the invention are recognized as being within the grasp of those having ordinary skill in the art.

For the purposes of describing the apparatus of the present invention, the terms "up", "down", "horizontal", "vertical", "above", "below", "proximal", "distal", or similar related terms may be used herein to describe the component parts of the apparatus and their relative positions. Such terms are used for convenience in reference to the attached drawing figures, but should not be interpreted as limiting the scope of the present invention.

Figure 1:
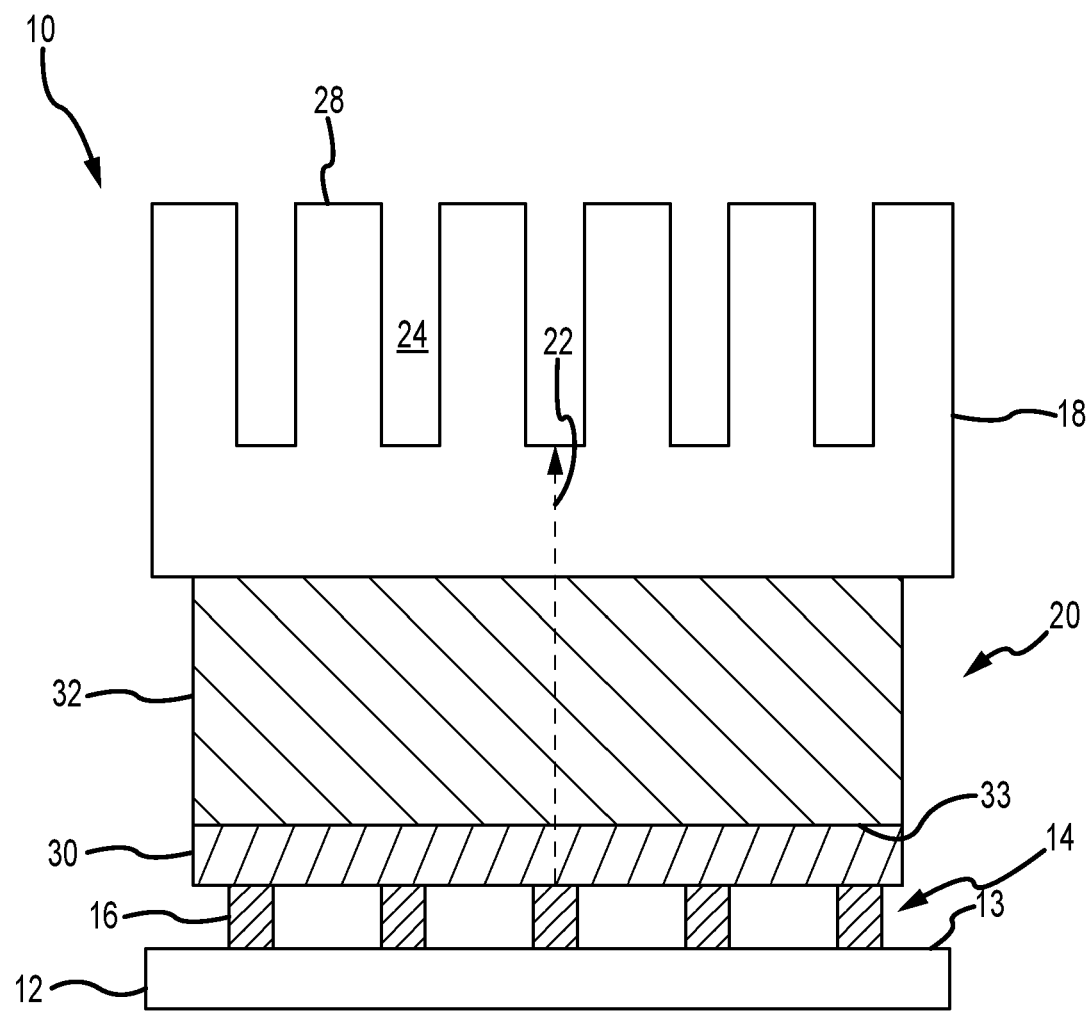
FIG. 1 is a cross-sectional view of an electronic package of the present invention.

With reference now to the drawing figures, and first to FIG. 1, an electronic package 10 includes a substrate 12 and an electronic component array 14 including a plurality of electronic components 16 secured to substrate 12. Electronic package 10 further includes a heat dissipater 18 and a thermal interface 20 positioned in a thermal pathway (designated by dashed arrow 22) between electronic component array 14 and heat dissipater 18. Electronic package 10 is arranged to dissipate thermal energy generated by electronic components 16 by providing a thermally conductive path from electronic component array 14 to a heat-absorbing fluid media 24 in contact with heat dissipater 18. In typical applications, fluid media 24 may be a gas, such as air, motivated by an air mover to absorb thermal energy from heat dissipater 18. Electronic package 10 is an example arrangement that may be modified as appropriate to accommodate a variety of electronic applications, such as data processors, data memory, communication boards, antennae, and the like. Such devices may be utilized in computing devices, communication devices, and peripherals therefor. In a particular example embodiment, electronic package 10 may be employed to support various functions in a cellular communication device.

Substrate 12 may serve one or more of a variety of functions in addition to being a support for electronic component array 14. For the purpose of simplicity in describing electronic package 10 of the present invention, substrate 12 may be a circuit board, such as a printed circuit board with electrically conductive traces on a mounting surface 13 for electrically connecting electronic components 16 as needed in the assembly. Components 16 may be electrically connected to wiring traces through soldering or other known techniques. In operation, electronic components 16 generate significant excess thermal energy which must be dissipated in order to maintain optimal performance. Electronic components 16 may be any of a variety of elements useful in an electronic process, and may include, for example, integrated circuits, resisters, transistors, capacitors, inductors, and diodes.

Thermal interface 20 provides a thermally conductive bridge between electronic component array 14 and heat dissipater 18 generally along a thermal pathway 22. Heat dissipater 18 may be thermally coupled to thermal interface 20 in a manner that most efficiently transmits thermal energy to heat dissipater 18. As schematically illustrated, heat dissipater 18 may have a configuration that incorporates a relatively high surface area, such as through fins 28. The use of heat dissipaters is well understood, and it is contemplated that conventional and custom designs may be utilized in the arrangements of the present invention.

A conventional approach for thermal interfaces includes a uniform and compliant thermally conductive mass such as a paste or gel. Another example interface includes oriented fiber devices with thermally conductive fibers oriented substantially parallel to the thermal pathway 22. As described above, such solutions may be inadequate for certain applications. Thermal interface 20 has been developed to most efficiently utilize a compliant thermally conductive volume of the interface to maximize thermal capacity. To do so, thermal interface 20 includes a heat spreading layer 30 for spreading thermal energy received from electronic components 16 across a broader area prior to transmission to a compliant layer 32. The heat transfer facilitated by the present arrangement more fully utilizes the total conductive capacity of thermal interface 20, which correspondingly increases overall thermal conductivity performance of thermal interface 20 when used in conjunction with a plurality of spaced-apart heat sources, such as electronic components 16.

Thermal interface 20 may be a multiple-layer composite including heat spreading layer 30 and compliant layer 32. Thermal interface 20 has a thickness "T" defined along a thickness axis 34 through heat spreading layer 30 and compliant layer 32. Heat spreading layer 30 has a thickness "$T_1$" that is less than 20% of thickness T, preferably less than 15% of T, and more preferably less than 10% of thickness T. In some embodiments, spreading layer 30 may have a thickness $T_1$ that is between 5-10% of thickness T of thermal interface 20.

Figure 2:
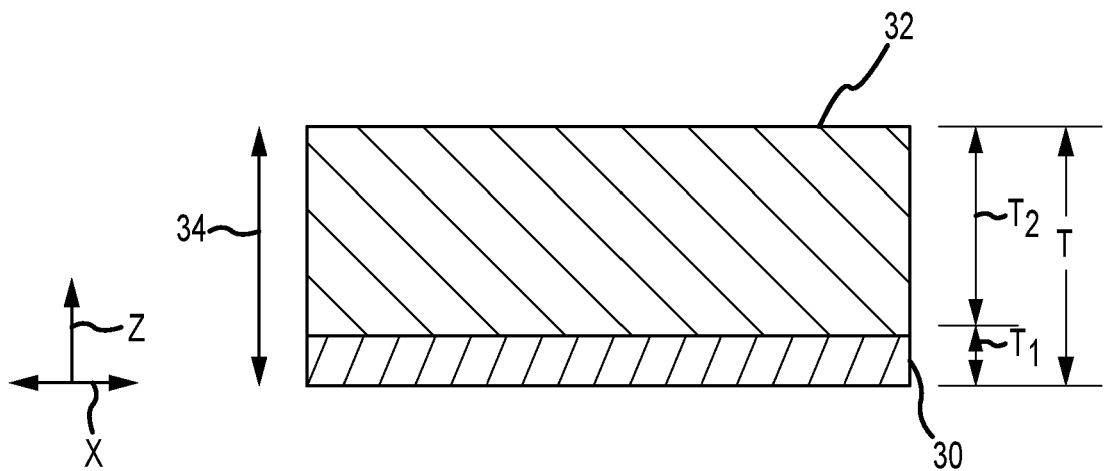
FIG. 2 is a cross-sectional view of a thermal interface portion of an electronic package of the present invention.
Figure 3:
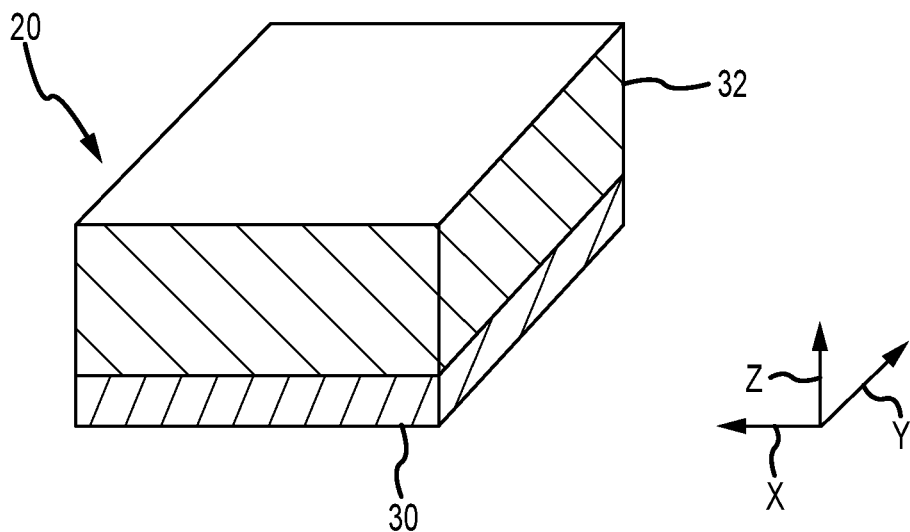
FIG. 3 is a perspective view of a thermal interface portion of an electronic package of the present invention.

Heat spreading layer 30 is relatively thin in comparison to the total thickness T of thermal interface 20 to promote a distribution of thermal energy substantially along the "x" and "y" axes, as illustrated in FIGS. 2 and 3. Heat spreading layer 30 preferably exhibits a first thermal conductivity "$C_1$" that is substantially greater than a second thermal conductivity "$C_2$" of compliant layer 32. Because thermal energy is transferred along a path of least resistance, thermal energy received by thermal interface 20 at heat spreading layer 30 will primarily transfer throughout heat spreading layer 30 before transferring through compliant layer 32. This "path of least resistance" effect causes the heat input from discrete electronic components 16 of electronic component array 14 to primarily spread throughout heat spreading layer 30 along both of the x and y axes before being transferred through the z axis. In this manner, thermal energy is transferred to compliant layer 32 substantially throughout an interfacial area represented at first surface 33 of compliant layer 32, and thereafter throughout substantially an entire volume of compliant layer 32. This approach maximizes the thermal conductance capacity of compliant layer 32. Without heat spreading layer 30 present at thermal interface 20, as in conventional pastes and gels, thermal input from discrete heat source points is typically not transferred throughout the thermal interface volume, and instead is transferred in more direct paths along a thickness axis to the heat dissipater.

To accomplish the heat spreading characteristic, heat spreading layer 30 preferably exhibits a first thermal conductivity $C_1$ of at least 100 W/m*K., and more preferably at least 400 W/m*K. In some embodiments, first thermal conductivity $C_1$ may be between 100-1500 W/m*K, and more preferably between 400-1000 W/m*K. For the purposes of the present invention, thermal conductivity of a layer or structure is determined by ASTM D5470. The thermal conductivity of heat spreading layer 30 may be substantially equal in three dimensions, or may be anisotropic with preferential heat transfer substantially along the x and y axes. In other words, the heat transfer through heat spreading layer 30 is preferably either substantially equal along all three axes (x, y, z), or exhibits preferential heat transfer along the z and y axes over heat transfer along the z axis, in the orientation illustrated in FIGS. 2 and 3. To serve the purpose of heat spreading along the x and y axes, it would be undesirable to employ an anisotropic heat spreading layer 30 that preferentially transfers heat along the z axis over heat transfer along the x and y axes. Example materials useful in heat spreading layer 30 include copper, aluminum, graphite, and boron nitride. Other highly thermally conductive materials, however, are contemplated as being useful in heat spreading layer 30 of the present invention.

To promote heat transfer along the x and y axes of thermal interface 20, heat spreading layer 30 is preferably relatively thin along thickness axis 34 in comparison to the total thickness T of thermal interface 20. Due to the substantially greater thermal conductivity of heat spreading layer 30 in comparison to compliant layer 32, a relatively thin heat spreading layer 30 more efficiently directs heat transfer along the x and y axes. However, Applicant has found that a balance is preferably struck between driving heat transfer along the x and y axes, and providing sufficient thermal capacity in heat spreading layer 30 to accommodate the thermal energy input from electronic component array 14 without prematurely transferring heat to compliant layer 32. Thus, at least in some embodiments, a minimum thickness threshold for heat spreading layer 30 is preferably maintained to accommodate a thermal energy input in a manner that does not "overload" the total thermal capacity of heat spreading layer 30 that could result in more direct heat transfer from the discrete heat sources through thickness axis 34. Accordingly, it is desired that heat spreading later thickness $T_1$ may represent at least 5% of the total thickness T of thermal interface 20, and more preferably between 5-20% of thickness T. In some embodiments, heat spreading layer thickness $T_1$ may be between 25-125 micrometers.

Compliant layer 32 is preferably thermally conductive at least along the z axis, and is preferably a conformable material to maximize thermal contact with heat dissipater 18. Compliant layer 32 may be formed from a variety of materials that may be used alone or in combination to create a conformable and thermally conductive mass. Preferably, compliant layer 32 is self-supporting at least at room temperature, wherein a defined three-dimensional shape for compliant layer 32 is self-maintained at least at room temperature and without applied external forces. Example materials for compliant layer 32 include microcrystalline wax or a silicone-based polymer include silicone waxes, silicone greases, and silicone gels. Examples of formulations useful in compliant layer 32 include those described in U.S. Pat. Nos. 5,950,066 and 6,197,859, the contents of which are incorporated herein by reference. In some embodiments, compliant layer 32 may include a phase-changing material having a melting point in the range of between about 40-80° C.

Compliant layer 32 may further include thermally conductive particulate matter dispersed therein to enhance thermal conductivity. A variety of thermally conductive particulate matter may be utilized to aid in the thermal conductivity of compliant layer 32, including, for example, alumina, aluminum nitride, boron nitride, graphite, silicon carbide, diamond, metallic powders, ceramic particles, carbon fibers and nanotubes, metal alloys, and combinations thereof. Particle sizes of up to about 200 micrometers are typical. The particulate filler material may be provided in compliant layer 32 at a concentration of between about 10 and 95% by weight. The loading levels of the particulate filler can affect the overall compressive modulus of compliant layer 32. Accordingly, it is desired to maintain a compressive modulus at room temperature of no greater than about $10^6$ Pa, and preferably between $10^4$-$10^6$ Pa. For the purposes hereof, the term "compressive modulus" is defined by the testing procedure ASTM D575.

Compliant layer 32 may exhibit a thermal conductivity $C_2$ that is substantially less than the heat spreading layer thermal conductivity $C_1$. Although low thermal impedance/high thermal conductivity is desirable in a thermal interface, maximizing thermal conductivity of the thermal interface body itself may come at the expense of conformability. Applicant recognizes that conformability can be even more important than the thermal conductivity within the thermal interface material in governing the effectiveness of the thermal interface material. Accordingly, a balance is often struck between thermal conductivity of the thermal interface and conformability of the thermal interface. The apparatus of the present invention strikes this balance by maintaining conformability in compliant layer 32, as expressed by its compressive modulus. Conformable thermal interface materials can range in thermal conductivity, but are typically less than 20 W/m*K. Compliant layer 32 therefore preferably exhibits a thermal conductivity at least along the z axis of between 1-15 W/m*K. In some preferred embodiments, the thermal conductivity of compliant layer 32 at least along the z axis is between 5-12 W/m*K. It is to be understood that localized thermal conductivity values at various points within compliant layer 32 and/or heat spreading layer 30 may be less than the values described above. However, the net thermal conductivity, at least along the z axis is preferably as described above.

Compliant layer 32 may be formed with a thickness dimension $T_2$ that may form the balance of thickness T of thermal interface 20 with heat spreading layer 30. However, it is contemplated that layers in addition to heat spreading layer 30 and compliant layer 32 may be present in thermal interface 20. In some example embodiments, compliant layer 32 may have a thickness $T_2$ of between 0.25-2.5 mm, and more preferably between 0.5-1 mm.

Figure 4:
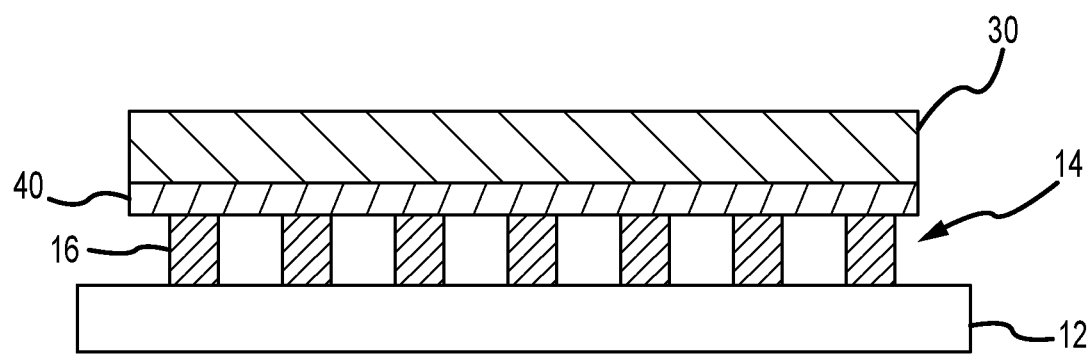
FIG. 4 is a FIG. 4 is a cross-sectional view of a portion of an electronic package of the present invention.

In some embodiments, an adhesion material 40 may be used for securing heat spreading layer 30 to electronic component array 14. As illustrated in FIG. 4, adhesion material 40, such as a pressure-sensitive adhesive may be applied to heat spreading layer 30 to secure heat spreading layer 30 to one or more electronic components 16 of electronic component array 14. Adhesion material 40 may be provided in a layer or in discrete lands for securement to one or more electronic components 16 of array 14. Adhesion material 40 may be thermally conductive, with a conductivity of at least about 0.5 W/m*K. Examples of useful adhesion materials include Bond Ply™ and LiquiBond™ thermally conductive adhesives available commercially from Henkel Corporation, Irvine, CA.

Thermal interface 20 may preferably be electrically insulative through thickness T along thickness axis 34. An advantage of thermal interface 20 over conventional highly thermally conductive interfaces is the applicability of thermal interface 20 in applications requiring electrical isolation. Some conventional highly thermally conductive interfaces depend upon structures and compositions that reduce electrical impedance to the point of forfeiting electrical isolation properties. An example conventional approach to highly thermally conductive interfaces uses oriented graphite which is oriented through the thickness of the interface to promote thermal conductivity along the z axis. In doing so, however, the oriented graphite forms an electrically conductive pathway through the thermal interface. Certain applications are not suitable for low electrical resistance thermal interfaces. Compliant layer 32 is preferably a non-conductor, such that thermal interface 20 exhibits an electrical resistivity of at least $10^8$ Ω*cm through thickness T along thickness axis 34. Thermal interface 20 may more preferably exhibit an electrical resistivity of at least $10^{10}$ Ω*cm through thickness T along thickness axis 34.

Figure 5:
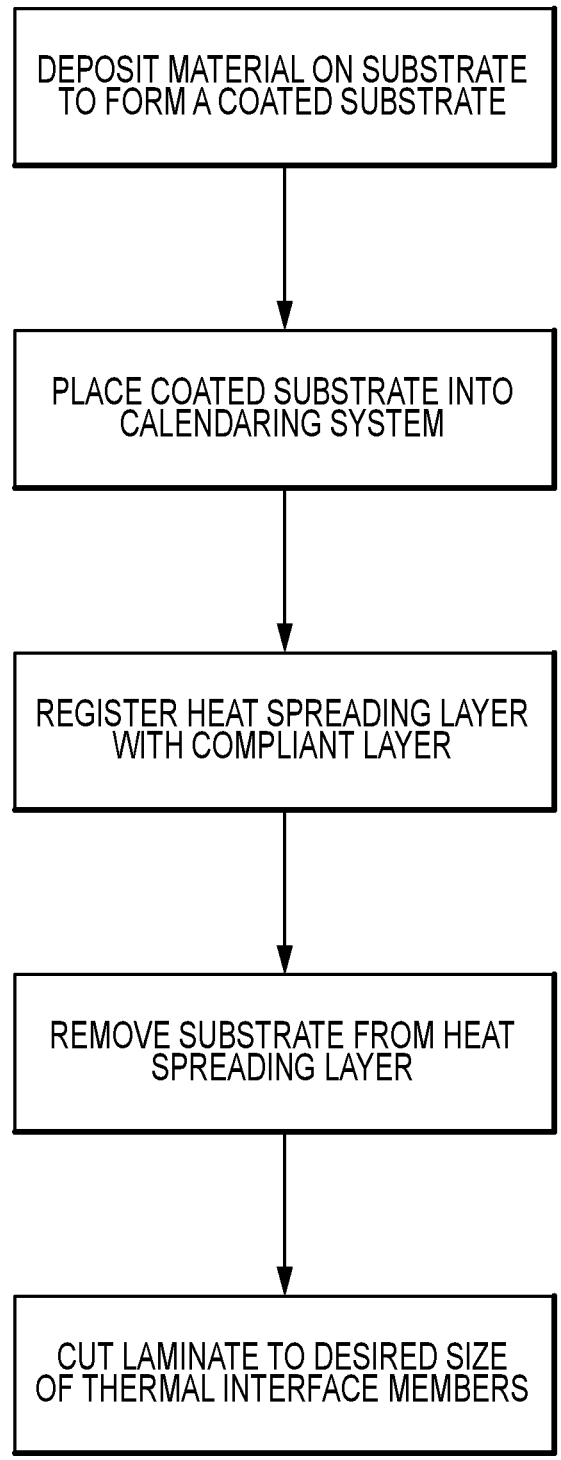
FIG. 5 is a flow diagram describing a process for manufacture of a thermal interface portion of an electronic package of the present invention.

It is contemplated that heat spreading layer 30 may be assembled to compliant layer 32 through one of a variety of processes, including, for example, vapor deposition, plasma polymerization, spray coating, sputtering, and the like. A flow diagram demonstrating example process steps of thermal interface fabrication is set forth in FIG. 5. In particular, a material for use in heat spreading layer 30 is deposited onto a release liner to a predetermined thickness so as to form a coated substrate. In some embodiments, the material might be applied to the substrate to a predetermined thickness of between about 25-125 micrometers. Release liners are well known in the art, and it is contemplated that conventional release liners capable of being relatively easily removed from heat spreading layer 30 may be utilized in the thermal interface manufacturing process. An example release liner useful in receiving a deposited heat spreading layer 30, and subsequently being removed therefrom, is polyethylene terephthalate (PET).

The coated substrate is then placed into a calendaring operation in an orientation with the release liner coming into contact with the calendaring rolls, and the heat spreading layer 30 material being exposed for registration with a compliant layer 32. The registration of the heat spreading layer 30 with the compliant layer 32 causes the heat spreading layer 30 to adhere to the compliant layer 32 with greater strength than the coupling between the heat spreading layer 30 and its respective release liner substrate. As a result, the substrate is then removed from the heat spreading layer 30 while the heat spreading layer 30 remains in contact with the compliant layer 32. Individual thermal interfaces may then be die cut to desired size.

An aspect of the present invention is how thermal interface 20 loses little of its thermal conductivity performance subsequent to compression along thickness axis 34. The thermal conductivity performance of certain thermal interfaces significantly degrades upon compression. This may be due to, for example, disruption of oriented fibers that are relied upon to achieve thermal conductivity performance. The construction of thermal interface 20 of the present invention permits compression along a thickness axis 34 without substantial degradation to its thermal performance.

Figure 6:
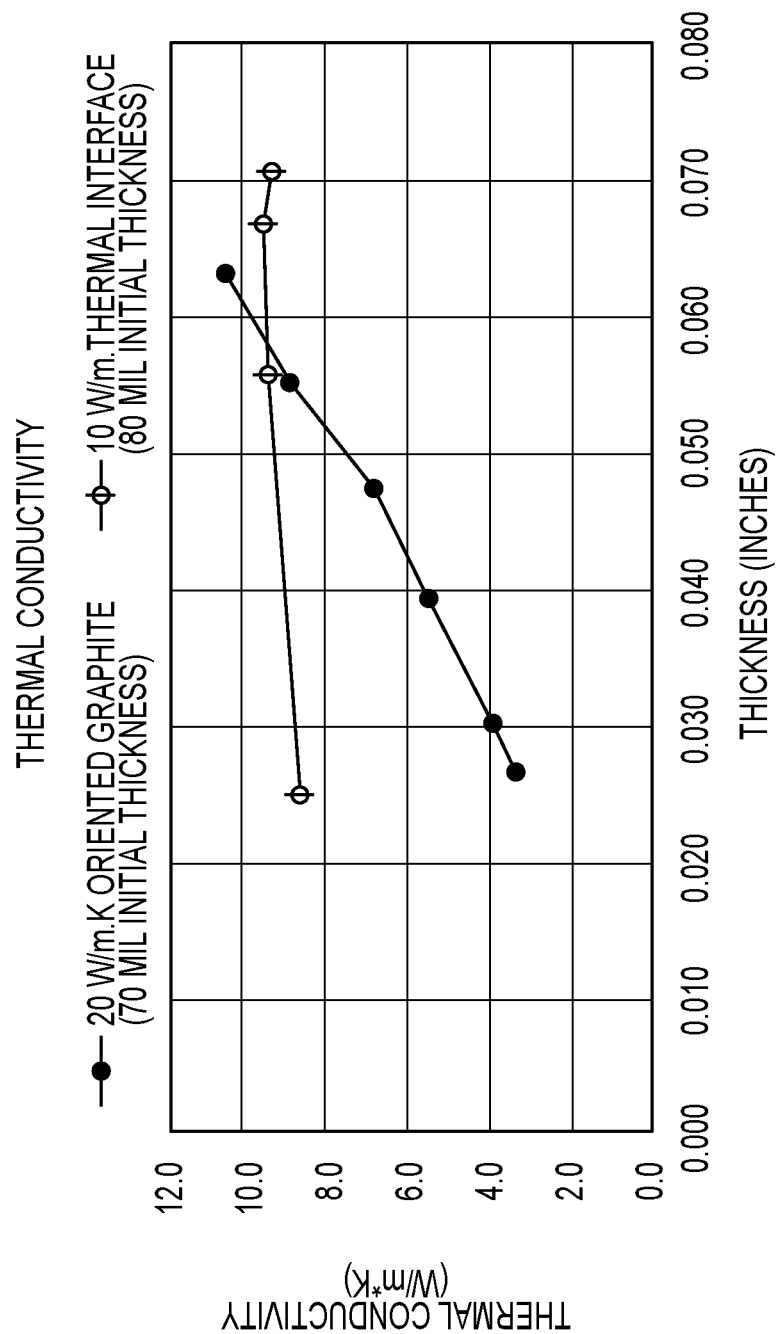
FIG. 6 is a comparison thermal conductivity chart.

FIG. 6 illustrates a comparison of thermal performance upon progressive compression along the respective thickness axis of a nominal 20 W/m*K oriented graphite thermal interface with an initial thickness of 0.07 inches compared to a 0.08 inch nominal 10 W/m*K thermal interface of the present invention. In particular, the comparison data of FIG. 6 shows that the oriented graphite interface decreases in thermal conductivity dramatically upon compression, while the thermal conductivity of the present arrangement is effected little, even upon significant compression. In preferred embodiments, thermal interface 20, having a thickness reduction of up to 50%, exhibits a compressed thermal conductivity that is at least 80% of its initial thermal conductivity. As illustrated in FIG. 6, the thermal conductivity of the nominal 10 W/m*K thermal interface is reduced by less than 20% after compression along its thickness axis by 50%.

Figure 7A:
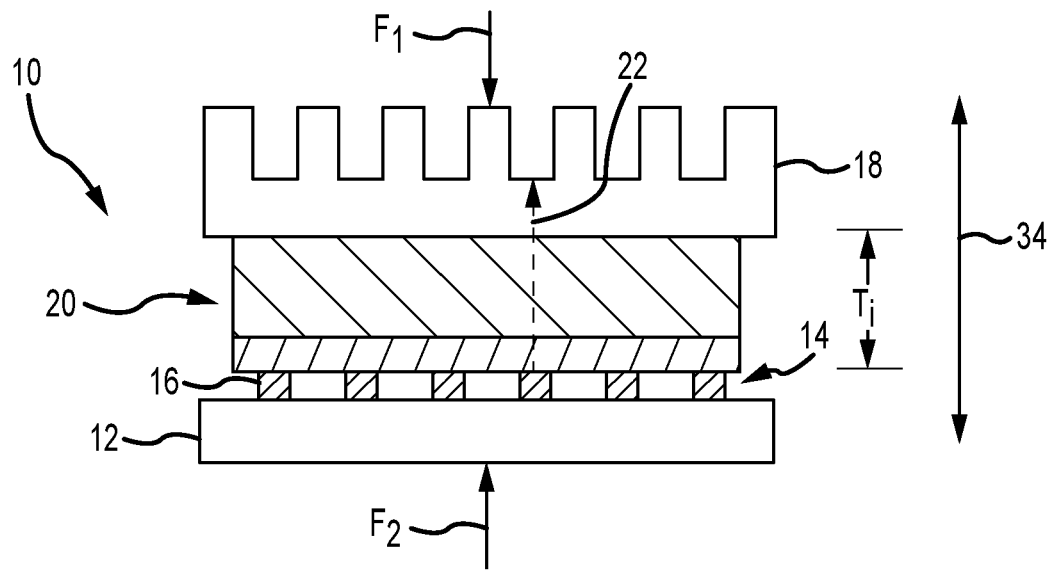
FIG. 7A is a cross-sectional view of an electronic package of the present invention under a compressive force.
Figure 7B:
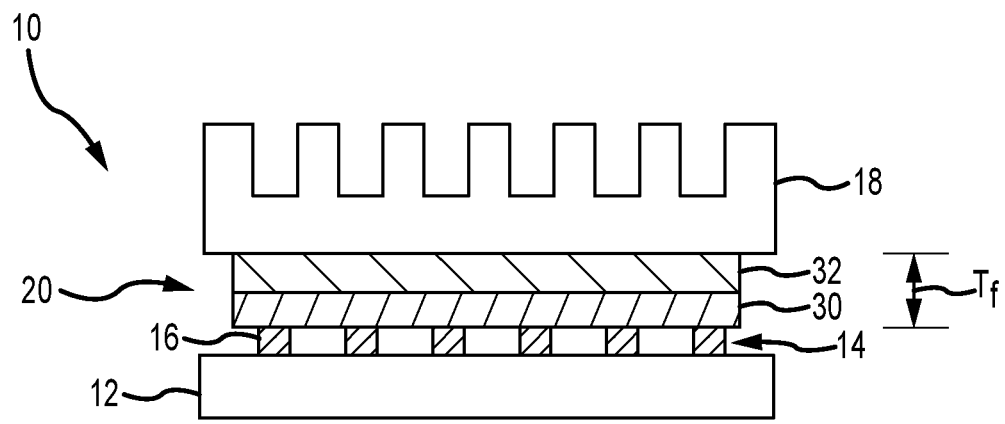
FIG. 7B is a cross-sectional view of an electronic package of the present invention subsequent to compression.

FIGS. 7A and 7B illustrate a method for preparing an electronic package of the present invention, wherein thermal interface 20 is affixed in a thermal pathway 22 between heat dissipater 18 and electronic component array 14 of a plurality of electronic components 16 secured to substrate 12. Thermal interface 20 is compressed along thickness axis 34 by applying force to one or both of heat dissipater 18 and substrate 12, as depicted by force vectors $F_1$, $F_2$. Conventional compression mechanisms may be employed to compress electronic package 10 to a desired extent. In some embodiments, electronic package 10 may be compressed along a thickness axis 34 to an extent such that thickness T of thermal interface 20 is reduced by up to 50%. FIG. 7B illustrates electronic package 10 subsequent to the compression process. Each of heat dissipater 18, electronic component array 14, and substrate 12 are relatively incompressible in comparison to thermal interface 20. In some embodiments, heat spreading layer 30 of thermal interface 20 is relatively incompressible in comparison to compliant layer 32. In such embodiments, the compression force $F_1$, $F_2$ applied to electronic package 10 may compress primarily only compliant layer 32 of thermal interface 20. In the example illustrated in FIGS. 7A and 7B, the initial thickness $T_i$ of thermal interface 20 may be reduced by up to about 50%, wherein the final thickness $T_f$ may be expressed by the relationship:

$$T_f = 0.5 \leq T_i \leq 1.0$$

As described above, it has been found by the Applicant that thermal interface 20 may be so compressed and yet substantially maintain its thermal conductivity performance. Such a characteristic is important in applications requiring or utilizing compression during assembly.

The invention has been described herein in considerable detail in order to provide those skilled in the art with the information needed to apply the novel principles and to construct and use embodiments of the invention as required. However, it is to be understood that various modifications can be accomplished without departing from the scope of the invention itself

What is claimed is:

1. An electronic package, comprising:
   a substrate;
   an electronic component array including a plurality of discrete spaced-apart electronic components secured to said substrate;
   a heat dissipater; and
   a thermal interface positioned in a thermal pathway between said electronic component array and said heat dissipater, said thermal interface including a heat spreading layer and a compliant layer, and a thickness defined along a thickness axis through said heat spreading layer and said compliant layer, wherein said heat spreading layer is less than 20% of the thickness and exhibits a first thermal conductivity, and said compliant layer exhibits a second thermal conductivity that is substantially less than the first thermal conductivity and a compressive modulus of between $10^4$ Pa-$10^6$ Pa.

2. The electronic package of claim 1 wherein said first thermal conductivity is at least 100 W/m*K, and said second thermal conductivity is between 1-15 W/m*K.

3. The electronic package of claim 2 wherein said thermal interface exhibits an electrical resistivity of at least $10^8$ Ω*cm through the thickness along the thickness axis.

4. The electronic package of claim 1 wherein said thermal interface is secured to at least one of said heat dissipater and said electronic component array.

5. The electronic package of claim 4, including an adhesion material for securing said heat spreading layer to a plurality of the electronic components of said electronic component array.

6. The electronic package of claim 5 wherein said adhesion material includes a pressure-sensitive adhesive.

7. The electronic package of claim 1 wherein said substrate is a circuit board.

8. The electronic package of claim 1 wherein said electronic components include one or more of an integrated circuit, a resistor, a transistor, a capacitor, an inductor, and a diode.

9. The electronic package of claim 1 wherein said heat spreading layer is selected from the group consisting of copper, aluminum, graphite, and boron nitride.

10. The electronic package of claim 1 wherein said heat spreading layer is between 25-125 μm along the thickness axis.

11. The electronic package of claim 1 wherein said compliant layer includes particulate filler dispersed in a silicone polymer matrix.

12. The electronic package of claim 1 wherein the thickness axis is parallel to said thermal pathway.

13. A method for preparing an electronic package, said method comprising:
   a. providing a thermal interface having a heat spreading layer and a compliant layer, and a thickness defined along a thickness axis through said heat spreading layer and said compliant layer, wherein said thermal interface exhibits an initial thermal conductivity, and wherein said heat spreading layer is less than 20% of the thickness and exhibits a thermal conductivity of at least 100 W/m*K, and said compliant layer exhibits a compressive modulus of between $10^4$ Pa-$10^6$ Pa;
   b. affixing said thermal interface in a thermal pathway between a heat dissipater and an electronic component array of a plurality of electronic components secured to a substrate; and
   c. compressing said thermal interface along the thickness axis to reduce said thickness, wherein the thermal interface, having a thickness reduction of up to 50%, exhibits a compressed thermal conductivity that is at least 80% of the initial thermal conductivity.

14. The method of claim 13 wherein said compliant layer of said thermal interface exhibits a thermal conductivity of between 1-15 W/m*K.

15. The method of claim 13 wherein said thickness axis is parallel to the thermal pathway.

16. The method of claim 13 wherein said thermal interface exhibits an electrical resistivity of at least $10^8$ Ω*cm through the thickness along the thickness axis.

17. The method of claim 13 wherein compressing includes moving at least one of said substrate and said heat dissipater toward the other of said substrate and said heat dissipater.

18. An electronic package, comprising:
   a substrate;
   an electronic component array including a plurality of discrete spaced-apart electronic components secured to said substrate;
   a thermal interface including a heat spreading layer and a compliant layer, and a thickness defined along a thickness axis through said heat spreading layer and said compliant layer, wherein said heat spreading layer is less than 20% of the thickness and exhibits a first thermal conductivity, and said complaint layer exhibits a second thermal conductivity that is substantially less than the first thermal conductivity and a compressive modulus of between $10^4$ Pa-$10^6$ Pa, wherein said heat spreading layer is thermally connected to said electronic component array; and a heat dissipater being thermally connected to said compliant layer of said thermal interface.

19. The electronic package of claim 18 wherein said first thermal conductivity is at least 100 W/m*k, and said second thermal conductivity is between 1-15 W/m*K.

20. The electronic package of claim 19 wherein said thermal interface exhibits an electrical resistivity of at least $10^8$ Ω*cm through the thickness along the thickness axis.

* * * * *